United States Patent [19]
Yamamoto et al.

[11] Patent Number: 5,650,665
[45] Date of Patent: Jul. 22, 1997

[54] HYBRID INTEGRATED CIRCUIT DEVICE INCLUDING CIRCUIT PATTERNS OF DIFFERENT CONDUCTIVITY AND CIRCUIT ELEMENTS MOUNTED ON AN INSULATING SUBSTRATE

[75] Inventors: Tomohiko Yamamoto; Shoichi Tanimata, both of Kanagawa-ken, Japan

[73] Assignee: Kabushiki Kaisha Toshiba, Kawasaki, Japan

[21] Appl. No.: 735,488

[22] Filed: Oct. 23, 1996

Related U.S. Application Data

[63] Continuation of Ser. No. 297,813, Aug. 30, 1994, abandoned.

[30] Foreign Application Priority Data

Aug. 30, 1993 [JP] Japan .................................. 5-237445
Aug. 10, 1994 [JP] Japan .................................. 6-188530

[51] Int. Cl.$^6$ .................................................. H01L 23/48
[52] U.S. Cl. .................. 257/773; 257/762; 257/786; 361/751; 361/774; 361/777; 361/779
[58] Field of Search ........................ 257/700, 676, 257/666; 361/748–751, 763, 764, 774–783, 777, 778, 773, 786, 762

[56] References Cited

U.S. PATENT DOCUMENTS

| | | | |
|---|---|---|---|
| 3,538,389 | 11/1970 | Levesque et al. | 361/751 |
| 3,628,095 | 12/1971 | Schwartz et al. | 361/779 |
| 3,821,610 | 6/1974 | Harcombe | 361/777 |
| 3,880,610 | 4/1975 | Long | 361/777 |
| 4,107,728 | 8/1978 | Max | 257/724 |
| 4,193,083 | 3/1980 | Max | 257/664 |
| 4,264,917 | 4/1981 | Ugon | 257/778 |
| 4,742,431 | 5/1988 | Igarashi | 361/398 |
| 4,751,136 | 6/1988 | Kamiya et al. | 428/317.1 |
| 4,891,789 | 1/1990 | Quattrini et al. | 361/777 |
| 4,942,453 | 7/1990 | Ishida et al. | 257/773 |
| 5,303,116 | 4/1994 | Grotz | 361/774 |

*Primary Examiner*—Sara W. Crane
*Assistant Examiner*—David B. Hardy
*Attorney, Agent, or Firm*—Oblon, Spivak, McClelland, Maier & Neustadt, P.C.

[57] ABSTRACT

A hybrid IC device has an insulation substrate 1. Circuit patterns 2 made of a thick copper film are formed on the substrate 1. The circuit patterns 2 include terminal patterns 8. Through-holes 7 electrically connect the terminal patterns 8 to terminal patterns 81 formed on the bottom surface of the substrate 1. Active elements such as transistors and ICs and passive elements such as resistors and capacitors are mounted on the top surface of the substrate 1 and are electrically connected to the circuit patterns 2. A conductive pattern 6 made of a thick copper film or a thick silver-platinum film is formed on the bottom surface of the substrate 1. The conductive pattern 6 is used for grounding and heat radiation. The conductive pattern 6 is electrically connected to the active and passive elements via through-holes. The through-holes are usually formed just under the active and passive elements. If the elements are transistors, the through-holes for the transistor are formed outside the orthogonal projection of the transistors on the substrate.

16 Claims, 8 Drawing Sheets

FIG. 4
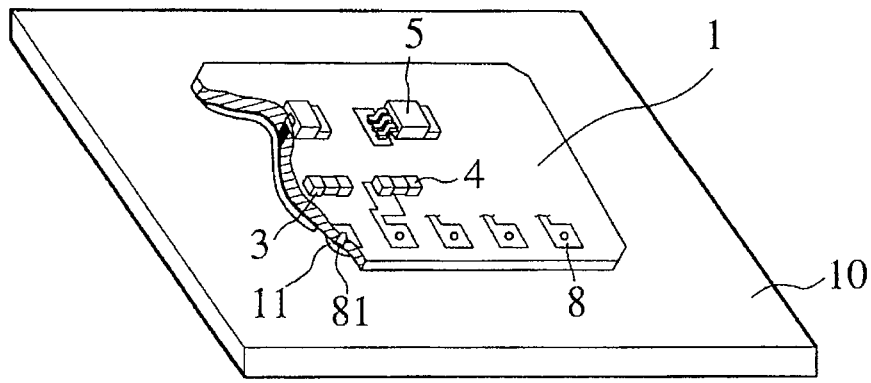
FIG. 5
| | 2.5 GHZ PATTERN LOSS |
|---|---|
| THICK COPPER FILM | −27.9 DB |
| THICK Ag−Pt FILM | −25.3 DB |
FIG. 6
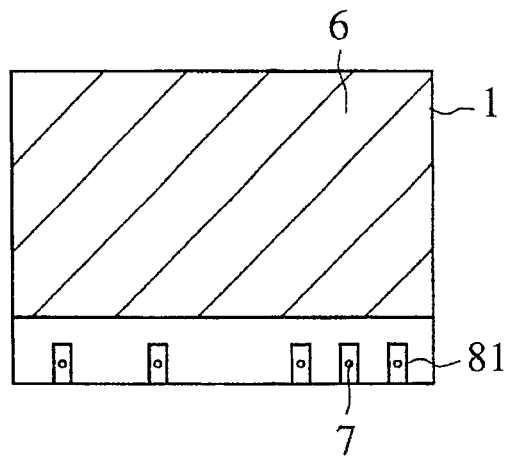

HYBRID INTEGRATED CIRCUIT DEVICE INCLUDING CIRCUIT PATTERNS OF DIFFERENT CONDUCTIVITY AND CIRCUIT ELEMENTS MOUNTED ON AN INSULATING SUBSTRATE

This is a continuation of application Ser. No. 08/297,813, filed on Aug. 30, 1994, now abandoned.

BACKGROUND OF THE INVENTION

1. Field of the Invention

The present invention relates to a hybrid integrated circuit device, and particularly, to a high-frequency power amplifier circuit device achieving high mechanical strength and improved heat radiation.

2. Description of the Prior Art

A conventional hybrid integrated circuit device (hereinafter referred to as the hybrid IC device) such as a high-frequency power amplifier circuit device has an insulation substrate for supporting circuit elements. The circuit elements include active elements such as ICs, transistors, and diodes, as well as passive elements such as resistors, capacitors, and coils. The substrate has on its bottom surface a conductive pattern, which is usually soldered to a metal flange. The metal flange radiates heat generated by the circuit elements and reinforces the breaking strength of a circuit board when the hybrid IC device is mounted onto the circuit board.

FIG. 1 shows an example of a conventional hybrid IC device.

An insulation substrate 41 is made of, for example, alumina. Circuit patterns 42 made of a thick copper film are formed on the substrate 41. Circuit elements are mounted on the substrate 41 and are electrically connected to the circuit patterns 42. The circuit elements include active elements such as resistors as well as passive elements such as transistors.

A metal flange 47 is soldered to a conductive pattern (not shown) formed on the bottom surface of the substrate 41. Clip-like lead terminals 43 hold terminals of the circuit patterns 42 and the metal flange 47 and are soldered together. The lead terminals 43 are fitted to a circuit board. The integrated circuit area on the substrate 41 is covered with a cap 46, to complete the hybrid IC device. The cap 46 is made from plastics or metal. The conductive pattern serves as a grounding pattern and its size is designed to attach the metal flange 47.

According to this prior art, the metal flange 47 will warp due to the difference between the thermal expansion coefficients of the substrate 41 and metal flange 47 that are soldered together. The warp disturbs heat radiation of the circuit elements and mechanically breaks the substrate 41 during heat cycle tests. Soldering the metal flange 47 to the substrate 41 is usually a separate process from mounting the circuit elements onto the substrate 41. This complicates and increases manufacturing processes.

SUMMARY OF THE INVENTION

An object of the present invention is to provide a hybrid IC device that radiates heat directly from the bottom surface of an insulation substrate, to improve the heat radiation performance, mechanical strength, and productivity of the device.

In order to accomplish the object, the present invention provides a hybrid IC device having an insulation substrate on which circuit patterns are formed. Circuit elements, such as a high frequency amplifier circuit, are mounted on the substrate and are connected to the circuit patterns. A conductive pattern serving as a heat radiation material is formed in a predetermined area on the bottom surface of the substrate. Terminal patterns are also formed on the bottom surface of the substrate and are electrically connected to the circuit patterns formed on the top surface of the substrate.

More precisely, the present invention provides a hybrid IC device having an insulation substrate, circuit patterns formed on the first principal surface of the substrate, circuit elements mounted on the substrate and electrically connected to the circuit patterns, a conductive pattern for grounding formed in a given area on the second principal surface of the substrate just under the circuit elements, and terminal patterns formed on the second principal surface and electrically connected to the circuit patterns on the first principal surface via through-holes formed through the substrate.

The conductive pattern for grounding serves as a heat radiation material. The conductive pattern may be covered with a corrosion-proof film. At least one through-hole may be formed through the conductive pattern and substrate, to electrically connect the conductive pattern to the circuit patterns. The conductive pattern and circuit patterns may be formed from different conductive materials. The conductive pattern may have slits.

This hybrid IC device employs no metal flange, so that there is no need to consider a warp of the flange. The conductive pattern formed on the second principal surface of the substrate just under the circuit elements serves as a heat radiation material to improve the heat radiation efficiency of the device.

BRIEF DESCRIPTION OF THE DRAWINGS

FIG. 4 is a perspective view showing a circuit board on which the hybrid IC device of FIG. 2 is mounted;

FIG. 5 is a table showing the resonance characteristics of a thick copper film and a thick silver-platinum film;

FIG. 6 is a plan view showing an insulation substrate according to a second embodiment of the present invention;

DETAILED DESCRIPTION OF THE EMBODIMENTS

Figure 2A:
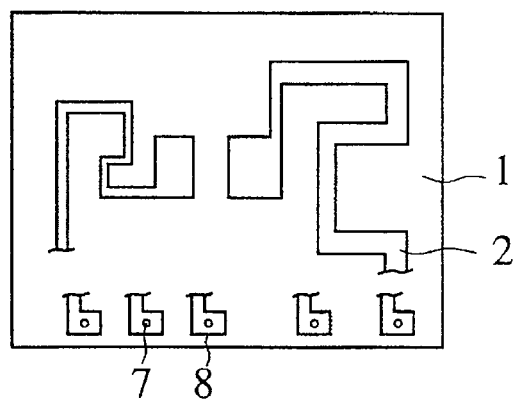
FIGS. 2A and 2B are plan views showing an insulation substrate according to a first embodiment of the present invention.
Figure 2B:
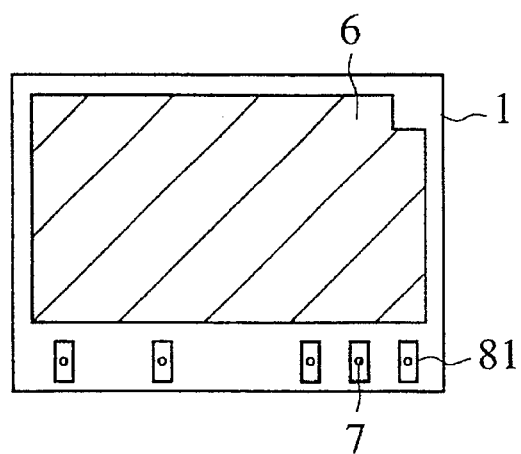
Figure 3:
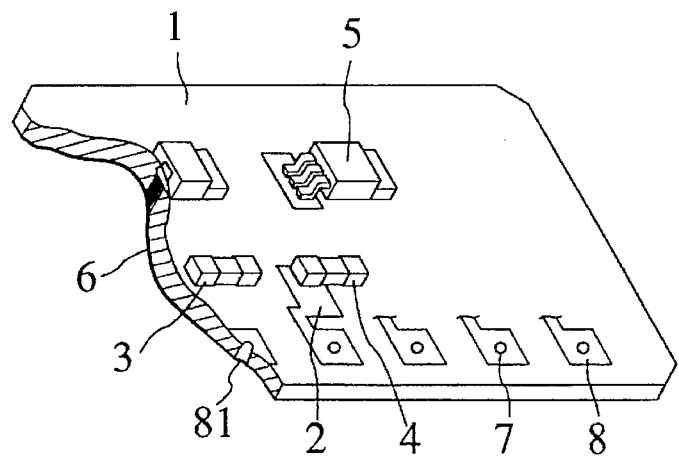
FIG. 3 is a perspective view showing a hybrid IC device according to the first embodiment.

A hybrid IC device according to the first embodiment of the present invention will be explained with reference to FIGS. 2 to 4. FIG. 2A is a plan view showing the first principal surface, i.e., the top surface of an insulation substrate 1, FIG. 2B is a plan view showing the second principal surface, i.e., the bottom surface of the substrate 1, FIG. 3 is a perspective view showing the hybrid IC device including circuit elements mounted on the first principal surface of the substrate 1, and FIG. 4 is a perspective view showing the hybrid IC device mounted on a circuit board 10.

The substrate 1 is made of ceramics such as alumina. High-frequency-transmission circuit patterns 2 are formed on the first principal surface of the substrate 1. The circuit patterns 2 include electrode patterns 8 serving as I/O terminals, etc. The circuit patterns 2 are formed by applying and baking thick conductive copper paste onto the substrate 1, or by depositing and etching a thick copper film on the substrate 1. A conductive pattern 6 made of, for example, a thick copper film as well as terminal patterns 81 made of, for example, a thick copper film are formed on the second principal surface of the substrate 1. The conductive pattern 6 serves as a grounding and heat radiation material.

To improve the heat radiation efficiency of the device, the conductive pattern 6 must be located at least just under the circuit elements mounted on the first principal surface of the substrate 1. The electrode patterns 8 and terminal patterns 81 serve as lead electrodes to be fitted to the circuit board 10. These lead electrodes are easy to handle compared with conventional lead terminals. Through-holes 7 are formed through the substrate 1, to electrically connect the electrode patterns 8 to the terminal patterns 81. The thickness of the conductive pattern 6 is about 10 to 30 micrometers.

Although this embodiment forms the circuit patterns 2 and conductive pattern 6 each from a thick copper film, they may be made from any other conductive material. The circuit patterns 2 and conductive pattern 6 may be made from different materials. For example, the circuit patterns 2 may be made from a thick copper film, and the conductive pattern 6 from silver-platinum (AgPt) alloy.

In FIGS. 3 and 4, the circuit elements include active elements 5 such as transistors, and passive elements 3 and 4 such as resistors and capacitors. These elements are fitted to the circuit patterns 2. The electrode patterns 8 are electrically connected to the terminal patterns 81 via the through-holes 7.

The hybrid IC device is used as, for example, a transmission amplifier, which is mounted on the circuit board 10 as shown in FIG. 4. The circuit board 10 is installed in, for example, a portable telephone or a car telephone. The substrate 1 is fixed to the circuit board 10 by solder 11. The dimensions of the substrate 1 are, for example, 17 millimeters×22 millimeters. The circuit board 10 supports this kind of hybrid IC devices and discrete circuit elements, to provide, for example, a portable telephone.

Since the substrate 1 on the circuit board 10 has no metal flange, it simplifies manufacturing processes and reduces its occupation area. The conductive pattern 6 is tightly attached to the substrate 1 just below the circuit elements, to improve heat radiation performance.

When the substrate 1 is mounted on the circuit board 10, the conductive pattern 6 on the bottom surface of the substrate 1 is directly soldered to the circuit board 10. Accordingly, the conductive pattern 6 must be protected against oxidization. The thick copper film that forms the conductive pattern 6 is excellent in conductivity but is easily oxidized in air, so that the conductive pattern 6 must be carefully handled.

The conductive pattern 6 may be made from a thick silver-platinum film. This material is resistive to oxidization but inferior to copper in conductivity.

FIG. 5 is a table showing the resonance characteristics of a thick copper film and a thick silver-platinum film. Each of the films has a resonance frequency of 2.5 GHz. This table shows that the copper film is more sensitive to the resonance frequency than the silver-platinum film by about 2.5 dB, to thereby produce a smaller power loss.

According to the present invention, the circuit patterns 2 that must be sufficiently conductive may be thick copper film wires that are highly conductive, and the conductive pattern 6 that must be sufficiently resistive to oxidization may be a thick silver-platinum film that is resistive to oxidization. Alternatively, the conductive pattern 6 may be a thick silver-palladium film or a molybdenum-manganese-metalized film.

To protect the conductive pattern 6 and terminal patterns 81 on the second principal surface of the substrate 1 against corrosion, they may be coated with corrosion prevention coating material, or may be plated with solder.

Figure 1:
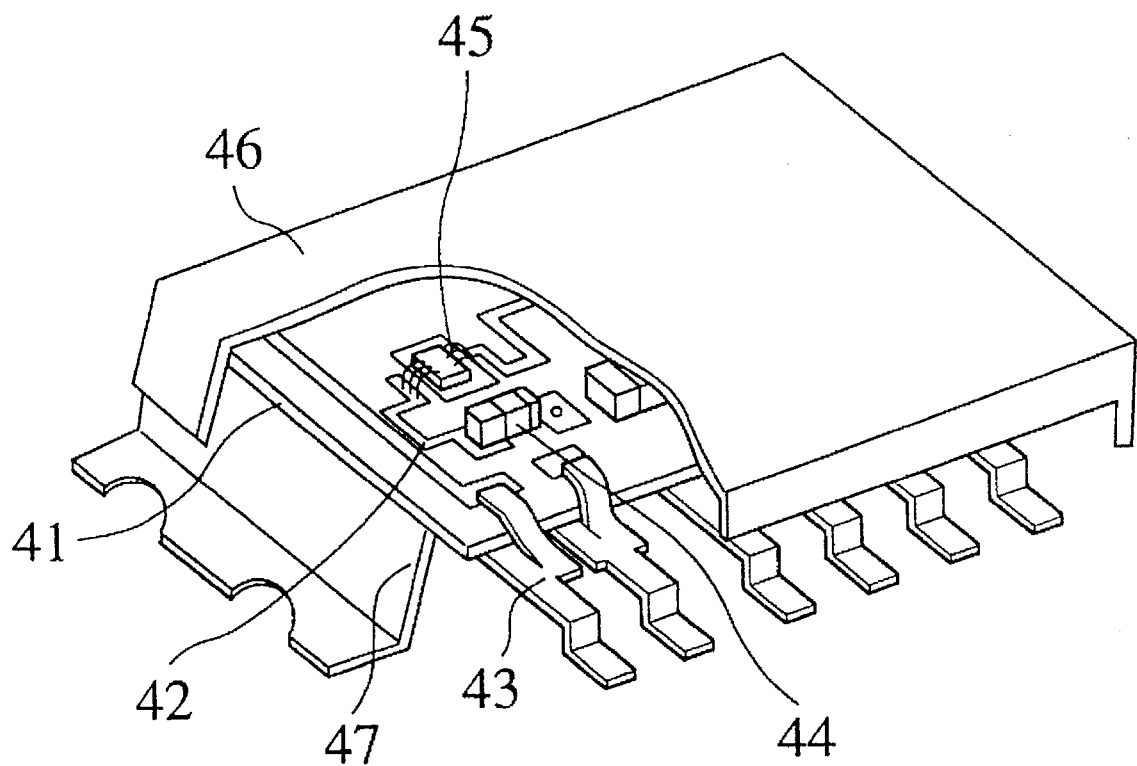
FIG. 1 is a perspective view showing a hybrid IC device according to a prior art.

The substrate 1 with the circuit elements is covered with a cap made of metal or plastics, as shown for example in FIG. 1 with respect to the caps.

Figure 7:
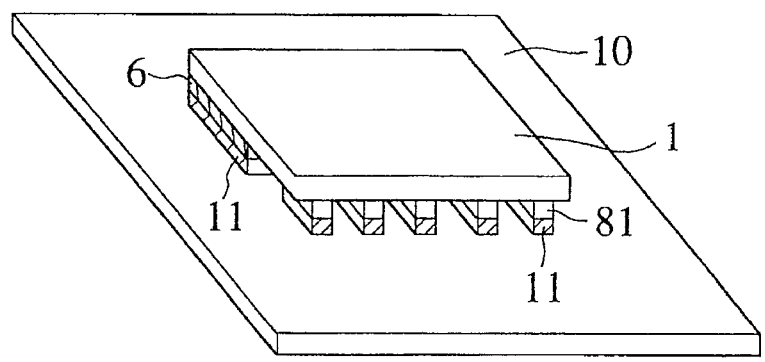
FIG. 7 is a perspective view showing a circuit board on which the substrate of FIG. 4 is mounted.

FIGS. 6 and 7 shows a hybrid IC device according to the second embodiment of the present invention. FIG. 6 is a plan view showing the second principal surface of an insulation substrate 1, and FIG. 7 is a perspective view showing a circuit board 10 onto which the substrate 1 with circuit elements is bonded.

The first embodiment of FIG. 2B forms the conductive pattern 6 and terminal patterns 81 slightly inside the edges of the second principal surface of the substrate 1. According to the second embodiment of FIG. 6, a conductive pattern 6 and terminal patterns 81 made from, for example, Ag-Pt extends up to the edges of the second principal surface of the substrate 1. Namely, the conductive pattern 6 and terminal patterns 81 can be seen from the side faces of the substrate 1. When a solder layer 11 is applied to the conductive pattern 6 and terminal patterns 81, to fix the substrate 1 to the circuit board 10, the solder layer 11 is visible as shown in FIG. 7. Then, it will be easy to check the condition of soldering. In FIG. 7, circuit patterns and circuit elements are not shown.

Figure 8A:
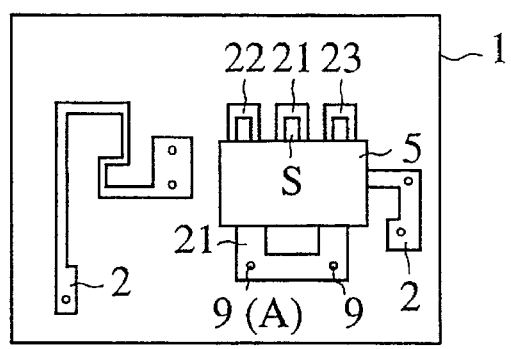
FIGS. 8A and 8B are plan views showing an insulation substrate according to a third embodiment of the present invention.
Figure 8B:
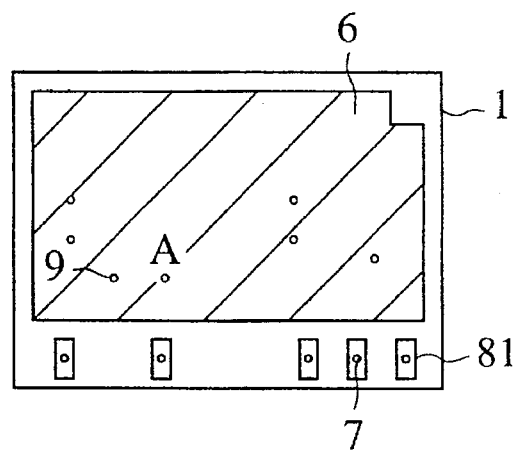

FIGS. 8A and 8B show a hybrid IC device according to the third embodiment of the present invention, in which FIG. 8A is a plan view showing the first principal surface of an insulation substrate 1 on which circuit elements are mounted, and FIG. 8B is a plan view showing the second principal surface of the substrate 1. The substrate 1 has through-holes 9 to ground the circuit elements on the first principal surface with respect to a conductive pattern 6 formed on the second principal surface.

Usually, the through-holes 9 are positioned to form shortest grounding paths between the circuit elements and the conductive pattern 6. For example, a through-hole for a capacitor chip mounted on the first principal surface of the substrate 1 is formed just under the chip, to prevent unnecessary inductance. In this case, the through-hole is invisible once the capacitor chip is mounted on the substrate 1 because it hides behind the capacitor chip.

The third embodiment is characterized in that no through-holes are made just under circuit elements if the circuit elements are transistors or ICs with transistors. In FIG. 8A, a transistor 5 is bonded to circuit patterns 2 formed on the first principal surface of the substrate 1. The source electrode S of the transistor 5 is connected to a grounding wire 21 of the circuit patterns 2, and the other electrodes thereof are connected to wires 22 and 23 of the circuit patterns 2, respectively.

The grounding wire 21 extends outside the transistor 5, and through-holes 9 and 9A are formed on the grounding wire 21 outside the transistor 5, to ground the source electrode S of the transistor 5. These through-holes are visible from the above even if the transistor 5 is mounted on the substrate 1. The reasons why no through-holes are formed just under transistors and ICs with transistors are because air may enter into such through-holes to extremely increase thermal resistance and because the transistors and the ICs with transistors generate heat.

Figure 9A:
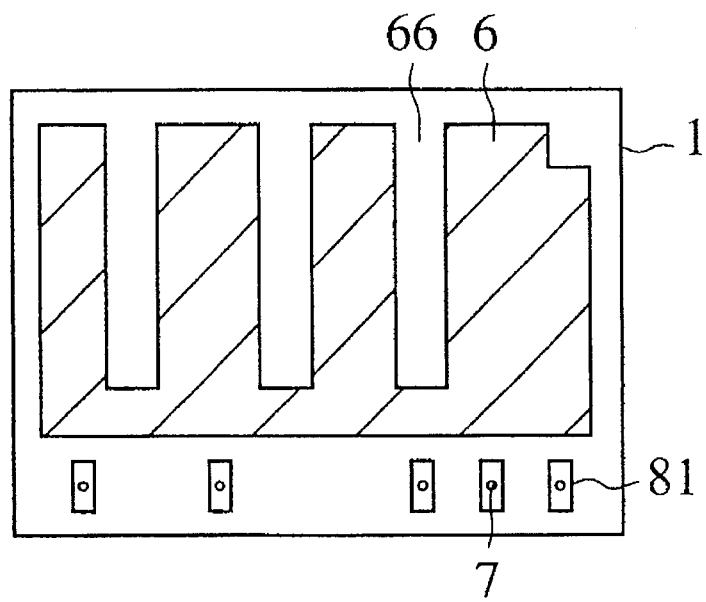
FIGS. 9A and 9B are plan views showing an insulation substrate according to a fourth embodiment of the present invention.
Figure 9B:
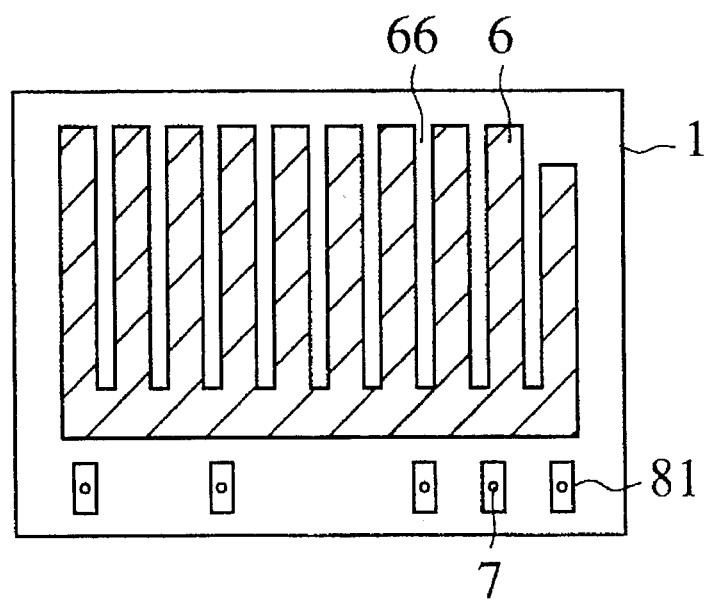

FIGS. 9A and 9B shows the fourth embodiment of the present invention.

FIG. 9A is a plan view showing the second principal surface of an insulation substrate 1 of a hybrid IC device. The hybrid IC device inevitably generates heat during operation. As a result, the difference between the thermal expansion coefficients of the substrate 1 and a conductive pattern 6 on the second principal surface of the substrate 1 produces stress, which may peel the conductive pattern 6 from the second principal surface. To solve this problem, the fourth embodiment forms slits 66 in the conductive pattern 6. The slits 66 relax the stress and reinforces the mechanical strength of the conductive pattern 6. The other parts of this embodiment are the same as those of the first embodiment.

In FIG. 9B, the width of each branch of a conductive pattern 6 separated by slits 66 is substantially equal to the thickness of an insulation substrate 1. This configuration is preferable.

Figure 10:
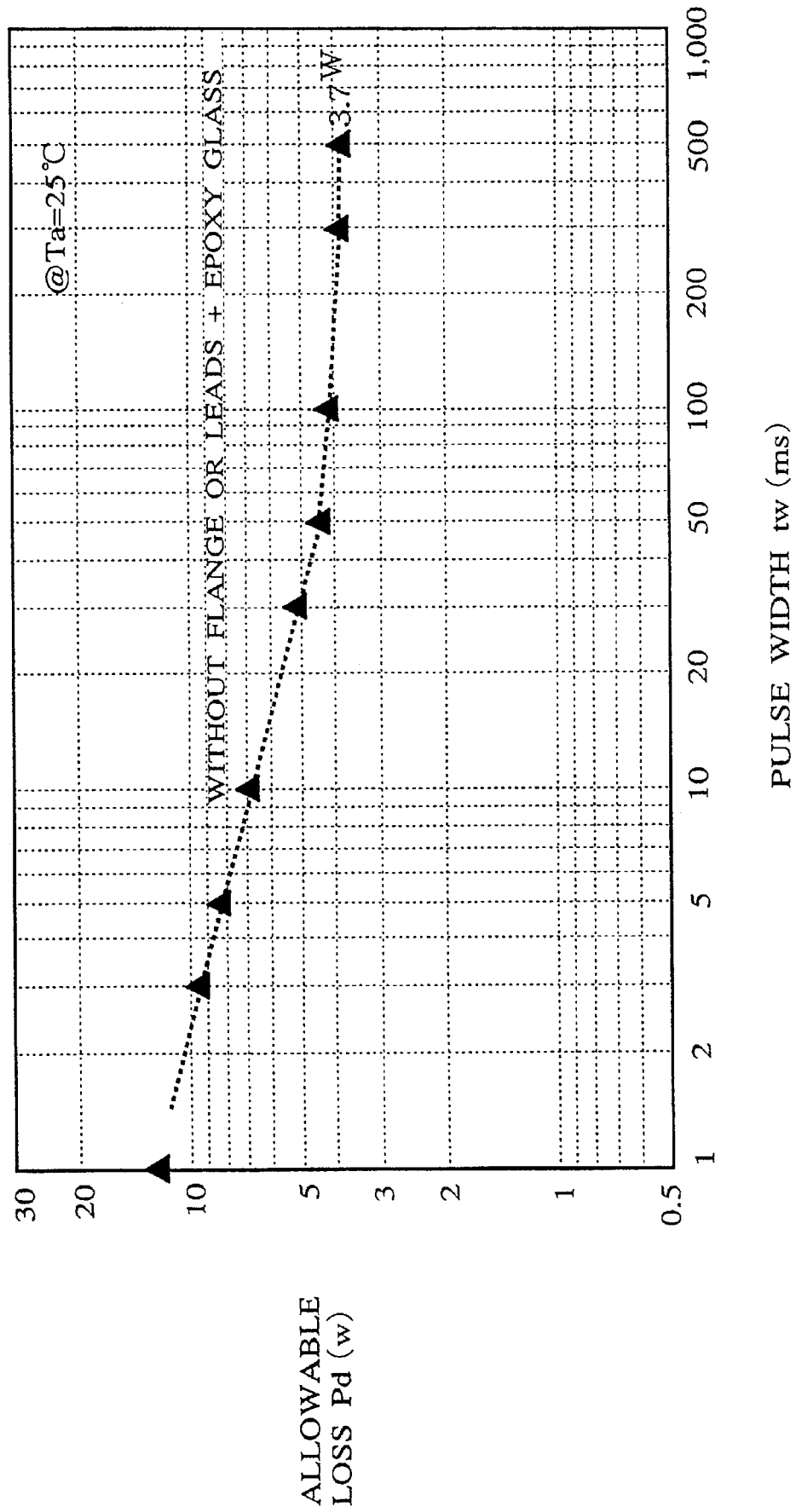
FIG. 10 is a graph showing the allowable loss of a hybrid IC device.

FIG. 10 shows the allowable loss of an active element mounted on an insulation substrate. The allowable loss of an active element is generally determined according to the thermal resistance of an insulation substrate on which the active element is disposed and the quantity of heat generated by the active element. FIG. 10 tells that no thermal trouble will be caused by an active element if the output power of the active element is less than 3 W under the conditions shown in FIG. 10. Any active element whose output power is 4 W or over will cause a problem this case, even the substrate of the fourth embodiment must have a square hole to directly attach a metal flange to the active element.

Figure 11A:
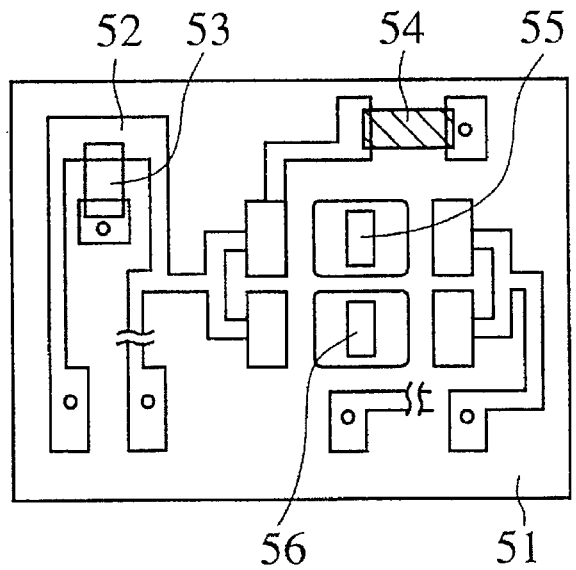
FIGS. 11A and 11B are plan views showing an insulation substrate according to a fifth embodiment of the present invention.
Figure 11B:
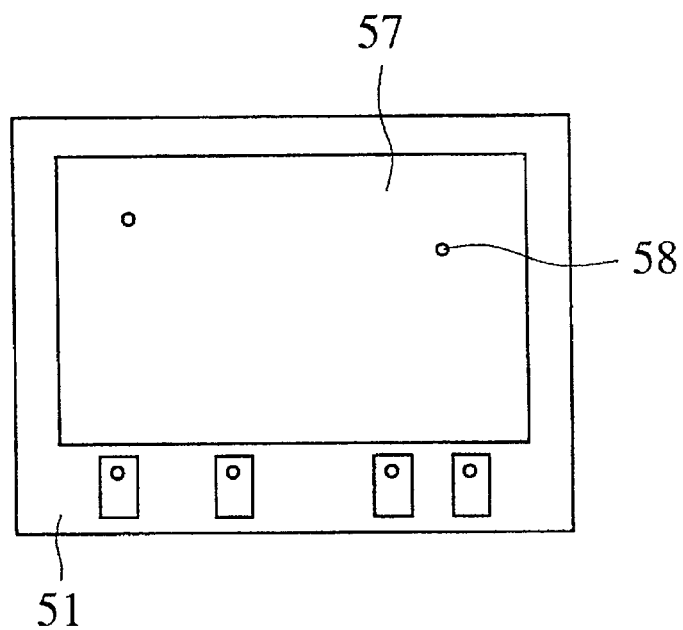
Figure 12:
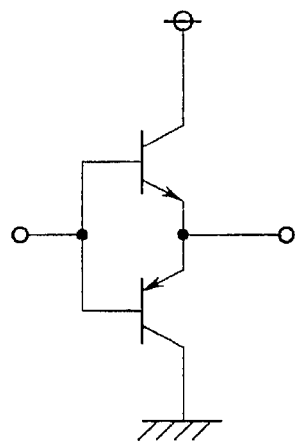
FIG. 12 is a circuit diagram showing an example of a push-pull circuit.

A hybrid IC device according to the fifth embodiment shown in FIGS. 11A and 11B is effective to solve this problem. FIG. 11A shows the first principal surface of an insulation substrate S1 of the hybrid IC device, and FIG. 11B shows the second principal surface of the same. The substrate 51 is made of alumina. Circuit patterns 52 film on the substrate 51. Circuit elements such as a capacitor 53, a resistor 54, and a B-class push-pull circuit are mounted on the patterns 52. The push-pull circuit is for amplification and includes transistors 55 and 56 that consume largest power in the device. Through-holes are formed through the substrate 1, to ground the patterns 52 with respect to a conductive pattern 57 formed on the second principal surface of the substrate 1. The conductive pattern 57 is directly soldered to a circuit board (not shown). FIG. 12 shows a circuit diagram showing the push-pull circuit.

The push-pull circuit alternately passes a current through the transistors 55 and 56, to provide an output. Accordingly, the quantity of heat generated by the transistors 55 and 56 of the push-pull circuit must be lower than that generated by the same transistors operating in parallel. Namely, the push-pull operation provides at least twice the output of the parallel operation with respect to the same allowable loss. To achieve the push-pull operation, the two active elements, i.e., the transistors 55 and 56 must be separated by 1.5 to 2 times the thickness of the substrate 51. With this distance, heat generated by the active elements will not interfere with each other when the heat diffuses at an angle of 45 degrees in a thermal diffusion model.

Figure 13:
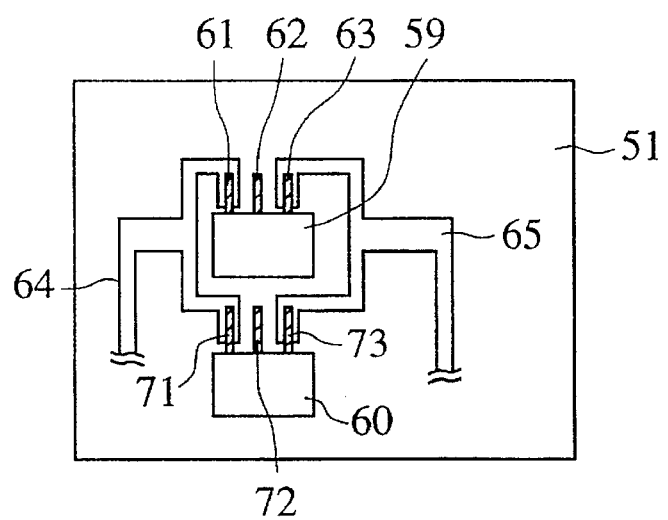
FIG. 13 is a plan view showing a modification of the fifth embodiment.

According to the present invention, branches for providing the two active elements with input power and paths for combining the outputs of the active elements must be precisely symmetrical. Even if these circuit patterns are precisely formed, bare chips easily cause displacements during a die bonding process and elongate loops during a wire bonding process. To solve this problem, the push-pull circuit according to the present invention employs resin-sealed transistors 59 and 60 as shown in FIG. 13. The transistor 59 has a gate 61, a source 62, and a drain 63, and the transistor 60 has a gate 71, a source 72, and a drain 73. The corresponding ones of these terminals are connected to each other. Numeral 64 is an input path, and 65 is an output path.

The resin-sealed active elements may halve the lengths of wires compared with bare chips, to reduce fluctuations in the wire lengths and improve mounting accuracy, thereby providing an accurate symmetrical configuration. Reducing the wire lengths results in lowering parasitic inductance and improving high-frequency performance.

Figure 14:
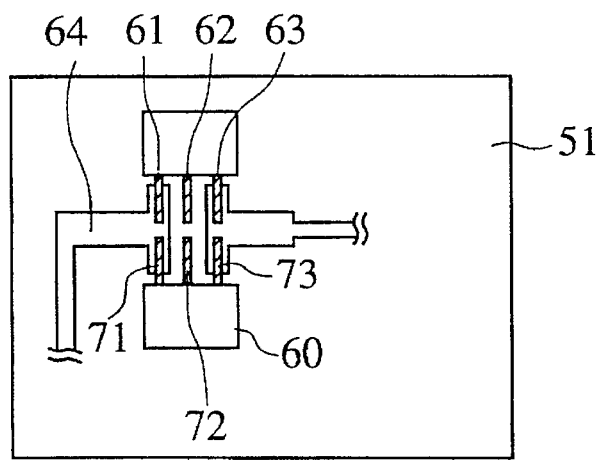
FIG. 14 is a plan view showing another modification of the fifth embodiment.

Active elements such as MOSFETs usually each have the same arrangement of source, drain, and gate. The embodiment of FIG. 14 employs two resin-sealed MOSFETs having gates 61 and 71, sources 62 and 72, and drains 63 and 73 that are symmetrically formed. When these MOSFETs are arranged to face each other, high-frequency transmission paths may be minimized, to reduce an area for mounting the MOSFETs.

The resin-sealed active elements are easy to fabricate into a product.

In summary, a hybrid IC device according to the present invention employs an insulation substrate that uses no metal flange, thereby maintaining the breaking strength of the substrate against heat cycles. A conductive pattern bonded to the substrate serves as a heat radiation material, to greatly improve the heat radiation performance of the device. This device employs no electrode lead wires, so that it is easy to handle. The device is small-sized because it employs no metal flange.

What is claimed is:

1. A hybrid IC device to be mounted on a circuit board through soldering, comprising:

an insulation substrate;

circuit patterns made from a first conductive material on a first principal surface of said insulation substrate;

circuit elements mounted on said insulation substrate and electrically connected to said circuit patterns;

a conductive pattern for grounding made from a second conductive material different than said first conductive material in a predetermined area on a second principal surface of said insulation substrate, the predetermined area at least including a zone just under said circuit elements, said conductive pattern serving as a heat radiation material, said conductive pattern being separated into branches by slits; and terminal patterns formed on the second principal surface of said insulation substrate and electrically connected to said circuit patterns via through-holes formed through said insulation substrate, wherein said hybrid IC is soldered to said circuit board across said second principal surface of said insulation substrate, and wherein said conductive pattern and said terminal patterns are used to make electrical connection with said circuit board.

2. The hybrid IC device according to claim 1, wherein said circuit patterns are made of copper.

3. The hybrid IC device according to claim 1, wherein the predetermined area of said insulation substrate where said conductive pattern is formed has at least one of said through-holes to electrically connect said circuit patterns to said conductive pattern.

4. The hybrid IC device according to claim 1, wherein said conductive pattern has at least nine slits.

5. The hybrid IC device according to claim 1, wherein said insulation substrate is made of a ceramic.

6. The hybrid IC device according to claim 1, wherein said conductive pattern and terminal patterns are covered with a corrosion prevention film made by coating corrosion prevention material.

7. The hybrid IC device according to claim 1, wherein said circuit elements comprise a high-frequency amplifier circuit.

8. The hybrid IC device according to claim 7, wherein the high-frequency amplifier circuit is a push-pull circuit.

9. The hybrid IC device according to claim 8, wherein the push-pull circuit includes two resin-sealed transistors.

10. The hybrid device according to claim 9, wherein said two resin-sealed transistors each comprise a source, a drain, and a gate and wherein the source, drain and gate of one transistor extend from one side face of said one transistor and the source, drain and gate of the other transistor extend from one face of the other transistor and symmetrically with respect to said source, drain and gate of the one transistor.

11. The hybrid IC device according to claim 1, wherein said conductive pattern and the terminal patterns are covered with a corrosion prevention film made by plating solder.

12. A hybrid IC device to be mounted on a circuit board through soldering comprising:

an insulation substrate;

circuit patterns made from a first conductive material on a first principal surface of said insulation substrate;

circuit elements mounted on said insulation substrate and electrically connected to said circuit patterns;

a conductive pattern for grounding made from a second conductive material in a predetermined area on a second principal surface of said insulation substrate, the predetermined area at least including a zone just under said circuit elements, said conductive pattern serving as a heat radiation material, said conductive pattern being separated into branches by slits; and terminal patterns formed on the second principal surface of said insulation substrate and electrically connected to said circuit patterns via through-holes formed through said insulation substrate, wherein the first conductive material is more conductive than the second conductive material, and wherein said hybrid IC is soldered to said circuit board across said second principal surface of said insulation substrate.

13. A hybrid IC device to be mounted on a circuit board through soldering comprising:

an insulation substrate;

circuit patterns made from a first conductive material on a first principal surface of said insulation substrate;

circuit elements mounted on said insulation substrate and electrically connected to said circuit patterns;

a conductive pattern for grounding made from a second conductive material in a predetermined area on a second principal surface of said insulation substrate, the predetermined area at least including a zone just under said circuit elements, said conducive pattern serving as a heat radiation material, said conductive pattern being separated into branches by slits; and terminal patterns formed on the second principal surface of said insulation substrate and electrically connected to said circuit patterns via through-holes formed through said insulation substrate, wherein the second conductive material is more resistive to oxidization than the first conductive materials, and wherein said hybrid IC is soldered to said circuit board across said second principal surface of said insulation substrate.

14. A hybrid IC device to be mounted on a circuit board through soldering comprising:

an insulation substrate;

circuit patterns made from a first conductive material on a first principal surface of said insulation substrate;

circuit elements mounted on said insulation substrate and electrically connected to said circuit patterns;

a conductive pattern for grounding made from a second conductive material in a predetermined area on a second principal surface of said substrate, the predetermined area at least including a zone just under said circuit elements, said conductive pattern serving as a heat radiation material, said conductive pattern being separated into branches by slits; and terminal patterns formed on the second principal surface of said insulation substrate and electrically connected to said circuit patterns via through-holes formed through said insulation substrate, wherein said second conductive material for grounding is made of a compound of silver and platinum, and wherein said hybrid IC is soldered to said circuit board across said second principal surface of said insulation substrate.

15. A hybrid IC device to be mounted on a circuit board through soldering comprising:

an insulation substrate;

circuit patterns made from a first conductive material on a first principal surface of said insulation substrate;

circuit elements mounted on said insulation substrate and electrically connected to said circuit patterns;

a conductive pattern for grounding made from a second conductive material in a predetermined area on a second principal surface of said insulation substrate, the predetermined area at least including a zone just under said circuit elements, said conductive pattern serving as a heat radiation material, said conductive pattern being separated into branches by slits; and terminal patterns formed on the second principal surface of said insulation substrate and electrically connected to said circuit patterns via through-holes formed through said insulation substrate, wherein each of the branches has a width between said slits substantially equal to a thickness of said insulation substrate, and wherein said hybrid IC is soldered to said circuit board across said second principal surface of said insulation substrate.

16. A hybrid IC device for use in a circuit board, said hybrid IC device comprising:

an insulation substrate;

circuit patterns made from copper formed on an upper surface of said insulation substrate;

a plurality of passive elements and active elements including transistors mounted on said insulation substrate and electrically interconnected therewith through said circuit patterns;

a conductive pattern for grounding made from an element selected from among the group consisting of silver-platinum, silver-palladium and molybdenum-manganese in a predetermined area on a rear surface of said insulation substrate opposite to said upper surface of said insulation substrate and electrically connected to said circuit patterns via first through-holes formed through said insulation substrate, said conductive pattern serving also as a heat radiation material; and terminal patterns formed on the rear surface of said insulation substrate and electrically connected to said circuit patterns via second through-holes formed through said insulation substrate, wherein said through-holes are located aside of said transistors in order to avoid heat accumulation just under said transistors due to air in said through-holes.

* * * * *